US009478667B2

(12) United States Patent
Moon et al.

(10) Patent No.: US 9,478,667 B2
(45) Date of Patent: Oct. 25, 2016

(54) THIN FILM TRANSISTOR SUBSTRATE, METHOD OF MANUFACTURING THE SAME, AND LIQUID CRYSTAL DISPLAY PANEL HAVING THE SAME (71) Applicant: SAMSUNG DISPLAY CO., LTD., Yongin, Gyeonggi-Do (KR)

(72) Inventors: Yeon Keon Moon, Seoul (KR); Masataka Kano, Hwaseong-si (KR); Sung-Hoon Yang, Seoul (KR); Ji Hun Lim, Goyang-si (KR); So Young Koo, Yongin-si (KR); Myoung Hwa Kim, Seoul (KR); Jun Hyung Lim, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 25 days.

(21) Appl. No.: 14/661,470

(22) Filed: Mar. 18, 2015

(65) Prior Publication Data
US 2016/0133754 A1 May 12, 2016

(30) Foreign Application Priority Data

Nov. 6, 2014 (KR) .................. 10-2014-0153779

(51) Int. Cl.
G02F 1/136 (2006.01)
G02F 1/1333 (2006.01)
H01L 29/786 (2006.01)
H01L 29/66 (2006.01)
G02F 1/1368 (2006.01)

(52) U.S. Cl.
CPC ....... *H01L 29/78645* (2013.01); *G02F 1/1368* (2013.01); *H01L 29/66742* (2013.01); *G02F 2001/13685* (2013.01)

(58) Field of Classification Search
CPC .......... G02F 1/1368; G02F 1/136227; G02F 1/136213; G02F 1/1333; G02F 1/133305; G02F 1/133351; H01L 27/1214; H01L 27/12
USPC ............................................. 349/42, 43, 158
See application file for complete search history.

(56) References Cited

U.S. PATENT DOCUMENTS

2003/0062574 A1* 4/2003 Hsieh ...................... H01L 27/11
257/379
2011/0121284 A1* 5/2011 Yamazaki ......... H01L 29/42392
257/43

FOREIGN PATENT DOCUMENTS

KR 10-2012-0060364 A 6/2012
KR 10-2014-0062884 A 5/2014

OTHER PUBLICATIONS

Chi-Sun Hwang; "Vertical Channel ZnO Thin-Film Transistors Using an Atomic Layer Deposition Method"; Electron & Telecommun. Res. Inst.; Oxide TFT Res. Team; Daejeon, South Korea; Jan. 9, 2014.

* cited by examiner

*Primary Examiner* — Mike Qi
(74) *Attorney, Agent, or Firm* — Lee & Morse P.C.

(57) ABSTRACT

A thin film transistor substrate includes a substrate, a bottom gate on the substrate, a first insulating layer on the substrate and on the bottom gate, a drain on the first insulating layer, a source on the first insulating layer, the source including a first source at a first side of the drain and a second source at a second side of the drain, an active layer on the first insulating layer, the active layer including a first active layer contacting the drain and the first source and a second active layer contacting the drain and the second source, a second insulating layer on the drain, the source, and the active layer, and a top gate on the second insulating layer.

20 Claims, 11 Drawing Sheets

THIN FILM TRANSISTOR SUBSTRATE, METHOD OF MANUFACTURING THE SAME, AND LIQUID CRYSTAL DISPLAY PANEL HAVING THE SAME

CROSS-REFERENCE TO RELATED APPLICATION

Korean Patent Application No. 10-2014-0153779, filed on Nov. 6, 2014, in the Korean Intellectual Property Office, and entitled: "Thin Film Transistor Substrate, Method of Manufacturing the Same, and Liquid Crystal Display Panel Having the Same," is incorporated by reference herein in its entirety.

BACKGROUND

1. Field

The present disclosure relates to a thin film transistor substrate, a method of manufacturing the same, and a liquid crystal display having the same.

2. Description of the Related Art

A thin film transistor (TFT) is used in various fields, e.g., as a switching and driving device in display devices such as a liquid crystal display (LCD), an organic light emitting diode display (OLED display), and an electrophoretic display. Recently, as the display size increases, there is a need for a TFT substrate which can be driven at a superhigh speed.

SUMMARY

In accordance with an aspect of the present disclosure, a thin film transistor substrate includes a substrate, a bottom gate on the substrate, a first insulating layer on the substrate and on the bottom gate, a drain on the first insulating layer, a source on the first insulating layer, the source including a first source at a first side of the drain and a second source at a second side of the drain, an active layer on the first insulating layer, the active layer including a first active layer contacting the drain and the first source and a second active layer contacting the drain and the second source, a second insulating layer on the drain, the source, and the active layer, and a top gate on the second insulating layer.

Each of the first active layer and the second active layer may include an inner channel area and an external channel area.

The inner channel area may be adjacent to the first insulating layer.

The external channel area may be adjacent to the second insulating layer.

The top gate may include a first top gate on the second insulating layer at a first side of the bottom gate, and a second top gate on the second insulating layer at a second side of the bottom gate.

A same voltage may be set to be applied to the bottom gate, the first top gate, and the second top gate.

A same voltage may be set to be applied to the first top gate and the second top gate, and a different voltage is set to be applied to the bottom gate.

Different voltages may be set to be applied to each of the bottom gate, the first top gate, and the second top gate.

The first active layer and the second active layer may extend along a bent surface of the bottom gate.

At least a part of the drain may overlap with the bottom gate.

In accordance with another aspect of the present disclosure, a method of manufacturing a thin film transistor includes forming a bottom gate on a substrate, forming a first insulating layer on the substrate and the bottom gate, forming a first active layer and a second active layer on a bent portion of the first insulating layer, forming a drain on the first insulating layer to contact the first active layer and the second active layer, forming a first source on the first insulating layer to contact the first active layer at a first side of the drain, and forming a second source on the first insulating layer to contact the second active layer at the other side of the drain, forming a second insulating layer on the drain, the first source, the second source, the first active layer, and the second active layer, and forming a first top gate at one side of the bottom gate on the second insulating layer and forming a second top gate at the other side of the bottom gate on the second insulating layer.

Each of the first active layer and the second active layer may include an inner channel area and an external channel area.

The inner channel area may be adjacent to the first insulating layer.

The external channel area may be adjacent to the second insulating layer.

A same voltage may be set to be applied to the bottom gate, the first top gate, and the second top gate.

A same voltage may be set to be applied to the first top gate and the second top gate, and a different voltage is set to be applied to the bottom gate.

Different voltages may be set to be applied to each of the bottom gate, the first top gate, and the second top gate.

Forming the drain may include forming the drain to at least partially overlap the bottom gate.

In accordance with yet another aspect of the present disclosure, a liquid crystal display panel includes a thin film transistor substrate including a bottom gate on a substrate, a first insulating layer on the substrate and on the bottom gate, a drain on the first insulating layer, a source on the first insulating layer, the source including a first source at a first side of the drain and a second source at a second side of the drain, an active layer on the first insulating layer, the active layer including a first active layer contacting the drain and the first source and a second active layer contacting the drain and the second source, a second insulating layer on the drain, the source, and the active layer, and a top gate on the second insulating layer, a pixel electrode electrically connected to the drain, an opposed substrate facing the thin film transistor substrate, and a liquid crystal layer between the thin film transistor substrate and the opposed substrate.

Each of the first active layer and the second active layer may include an inner channel area adjacent to the first insulating layer and an external channel area adjacent to the second insulating layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer, i.e., element, is referred to as being "on" another layer or substrate, it can be directly on the other layer or substrate, or intervening layers may also be present. Further, it will be understood that when a layer is referred to as being "connected to" another layer, it can be directly connected to the other layer, or one or more intervening layers may also be present. In addition, it will also be understood that when a layer is referred to as being "between" two layers, it can be the only layer between the two layers, or one or more intervening layers may also be present. In contrast, when a layer is referred to as being "directly on," "directly connected to," or "directly between" layers, there are no intervening elements or layers present. Like reference numerals refer to like elements throughout.

As used herein, the term "and/or" includes any and all combinations of one or more of the associated listed items. Also, spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the disclosure. Accordingly, the exemplary views may be modified depending on manufacturing technologies and/or tolerances. Therefore, the embodiments of the disclosure are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the disclosure.

Hereinafter, embodiments of the present disclosure will be described with reference to the attached drawings.

Figure 1:
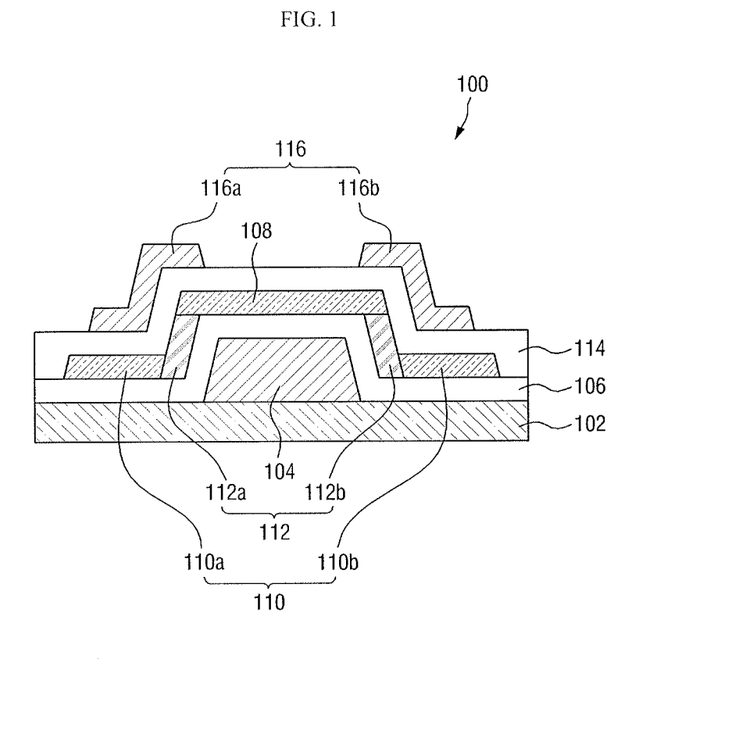
FIG. 1 illustrates a cross-sectional view of a thin film transistor substrate according to an embodiment of the present disclosure.

FIG. 1 illustrates a cross-sectional view of a thin film transistor substrate according to an embodiment of the present disclosure.

Referring to FIG. 1, a thin film transistor substrate 100 according to an embodiment of the present disclosure may include a substrate 102, a bottom gate 104 which is positioned on the substrate 102, a first insulating layer 106 which is positioned on the substrate 102 and the bottom gate 104, a drain 108 which is positioned on the first insulating layer 106, a source 110 including a first source 110a which is positioned on the first insulating layer 106 at a first side of the drain 108 and a second source 110b which is positioned on the first insulating layer 106 at a second side of the drain 108, an active layer 112 including a first active layer 112a which is positioned on the first insulating layer 106 and contacts the drain 108 and the first source 110a and a second active layer 112b which is positioned on the first insulating layer 106 and contacts the drain 108 and the second source 110b, a second insulating layer 114 which is positioned on the drain 108, the source 110, and the active layer 112, and a top gate 116 which is positioned on the second insulating layer 114.

The substrate 102 may have a shape of, e.g., a plate, a rectangular parallelepiped, etc. At least one surface of the substrate 102 may be flat, and various structures for forming a display device on the flat surface may be formed.

The substrate 102 may include a transparent insulating substrate. For example, the substrate 102 may be formed of a glass substrate, a quartz substrate, a transparent resin substrate, etc. Further, the substrate 102 may include a polymer having a high heat resistibility. For example, the substrate 102 may include at least one of polyethersulphone, polyacrylate, polyetherimide, polyethylene naphthalate, polyethylene terephthalate, polyphenylene sulfide, polyallylate, polyimide, polycarbonate, cellulose triacetate, cellulose acetate propionate, polyaryleneether sulfone, and a combination thereof.

The substrate 102 may have flexibility. That is, the substrate 102 may be a substrate which may be shape-modified by rolling, folding, bending, etc.

The first insulating layer 106 and the second insulating layer 114 may be formed of inorganic materials. For example, the first insulating layer 106 and the second insulating layer 114 may be composed of a silicon compound. In detail, the first insulating layer 106 and the second insulating layer 114 may include a silicon oxide, a silicon nitride, a silicon oxynitride, a silicon carbonitride, a silicon oxycarbide, etc. These silicon compounds may be solely used or may be combined to be used. Further, the first insulating layer 106 and the second insulating layer 114 may have a single layer structure or a multi-layer structure including a silicon oxide, a silicon nitride, a silicon oxynitride, a silicon carbonitride, and/or a silicon oxycarbide, etc.

The drain 108, the first source 110a, and the second source 110b may respectively include a metal, an alloy, a metal nitride, a conductive metal oxide, a transparent conductive material, and/or a semiconductor material. For example, each of the drain 108, the first source 110a, and the second source 110b may be formed of aluminum, an alloy containing aluminum, an aluminum nitride, silver, an alloy containing silver, tungsten, a tungsten nitride, cooper, an alloy containing cooper, nickel, chromium, a chromium nitride, molybdenum, an alloy containing molybdenum, titanium, a titanium nitride, platinum, tantalum, a tantalum nitride, neodymium, scandium, a strontium ruthenium oxide, a zinc oxide, an indium tin oxide, a gallium oxide, indium zinc oxide, etc. They may be solely used or may be combined to be used. Each of the drain 108, the first source 110a, and the second source 110b may have a single layer structure or a multi-layer structure composed of the above-described metal, alloy, metal nitride, conductive metal oxide, transparent conductive material, etc.

The first active layer 112a and the second active layer 112b may be arranged in an area adjacent to an area where there is a bend or a step which is formed on the first insulating layer 106 due to the bottom gate 104. For example, as illustrated in FIG. 1, the first insulating layer 106 may be formed conformally on the bottom gate 104, such that the first insulating layer 106 may include parallel portions on the substrate 102 and on a top surface of the bottom gate 104, and inclined portions on side surfaces of the bottom gate 104. Accordingly, the source 110 and drain 108 may be positioned on the substrate 102 and the top surface of the bottom gate 104, respectively, i.e., on the parallel portions of the first insulating layer 116, while the active layer 112 may be positioned on the side surfaces of the bottom gate 104, i.e., on the inclined portions of the first insulating layer 116. In other words, the first active layer 112a may extend along a first side surface of the bottom gate 104 between the first source 110a and the drain 108, while the second active layer 112b may extend along a second side surface of the bottom gate 104 between the second source 110b and the drain 108.

FIG. 1 illustrates the cross-section of the first active layer 112a and the second active layer 112b in a parallelogram shape, but the shape of the cross-section is not limited to the parallelogram and may be formed in other various shapes, e.g., a rectangular shape or a partly curved shape. In some embodiments, the first active layer 112a and the second active layer 112b may be formed of an amorphous silicon layer, but the embodiment is not limited thereto, e.g., the first active layer 112a and the second active layer 112b may also be formed of an oxide semiconductor layer.

The top gate 116 may include a first top gate 116a and a second top gate 116b. The first top gate 116a is positioned on the second insulating layer 114 at a first side of the bottom gate 104, i.e., to at least partially overlap the first source 110a and the first active layer 112a, and the second top gate 116b is positioned on the second insulating layer 114 at a second side of the bottom gate 104, i.e., to at least partially overlap the second source 110b and the second active layer 112b.

The bottom gate 104 and the top gate 106 may be formed of aluminum, an alloy containing aluminum, an aluminum nitride, silver, an alloy containing silver, tungsten, a tungsten nitride, cooper, an alloy containing cooper, nickel, chromium, a chromium nitride, molybdenum, an alloy containing molybdenum, titanium, a titanium nitride, platinum, tantalum, a tantalum nitride, neodymium, scandium, a strontium ruthenium oxide, a zinc oxide, an indium tin oxide, a gallium oxide, indium zinc oxide, etc. They may be solely used or may be combined to be used.

Figure 2:
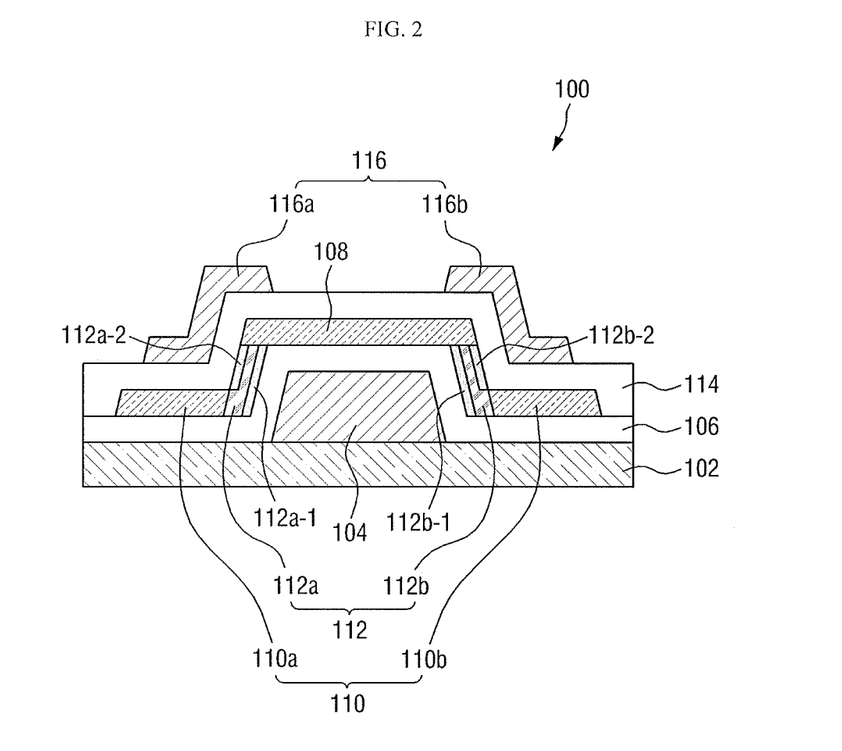
FIG. 2 illustrates a cross-sectional view of a channel on an active layer of a thin film transistor according to an embodiment of the present disclosure.

The first active layer 112a and the second active layer 112b of the thin film transistor substrate 100 according to an embodiment of the present disclosure respectively include an inner channel area and an external channel area, as will be described in more detail below with reference to FIGS. 2-3. FIG. 2 illustrates a cross-sectional view of a channel in the active area 112, and FIG. 3 is an enlarged, cross-sectional view of a channel in the first active layer 112a.

Figure 3:
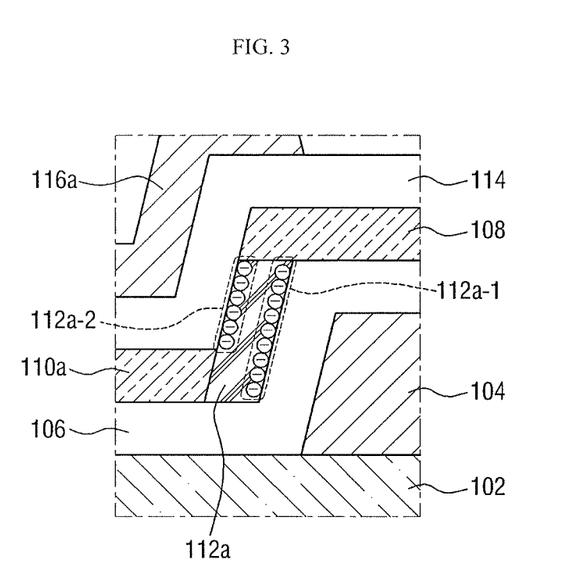
FIG. 3 illustrates an enlarged, cross-sectional view of the channel in FIG. 2.

Referring to FIGS. 2 and 3, the first active layer 112a includes an inner channel area 112a-1 and an external channel area 112a-2, and the second active layer 112b includes an inner channel area 112b-1 and an external channel area 112b-2. The inner channel areas 112a-1 and 112b-1 and external channel areas 112a-2 and 112b-2 may be defined as areas where a channel is formed in the active layer 112 according to operation of the thin film transistor substrate 100. In detail, if a threshold or higher voltage is applied to the bottom gate 104 or the top gate 106, a channel may be formed in the active layer 112. As shown in FIGS. 2 and 3, the channel may be an electron layer which is arranged along a boundary of the first insulating layer or the second insulating layer.

In further detail, the inner channel areas 112a-1 and 112b-1 may include an area where a channel is formed within the active layer 112 near, i.e., at, the boundary with the first insulating layer 106. The inner channel areas 112a-1 and 112b-1 may include the first inner channel area 112a-1 which is an area where a channel is formed near, e.g., along, the boundary with the first insulating layer 106 on the first active layer 112a, and the second inner channel area 112b-1 which is an area where a channel is formed near, e.g., along, the boundary with the first insulating layer 106 on the second active layer 112b. The channel may be simultaneously formed on the first inner channel area 112a-1 and the second inner channel area 112a-2 by the voltage which is applied to the bottom gate 104.

The external channel areas 112a-2 and 112b-2 may include an area where a channel is formed within the active layer 112 near, i.e., at, the boundary with the second insulating layer 114. That is, the external channel areas 112a-2 and 112b-2 may include the first external channel area 112a-2 where a channel is formed near, e.g., along, the boundary with the second insulating layer 114 on the first active layer 112a, and the second external channel area 112b-2 which is an area where a channel is formed near, e.g., along, the boundary with the second insulating layer 114 on the second active layer 112b.

With respect to the channel formation, the attached drawings do not show a separate electron layer on the bottom of the first active layer 112a and the second active layer 112b. However, if a threshold or higher voltage is applied to the bottom gate 104, the drain 108 and the first source 110a and the drain 108 and the second source 110b may be conductive also through the bottom part of the first active layer 112a and the second active layer 112b.

Figure 4:
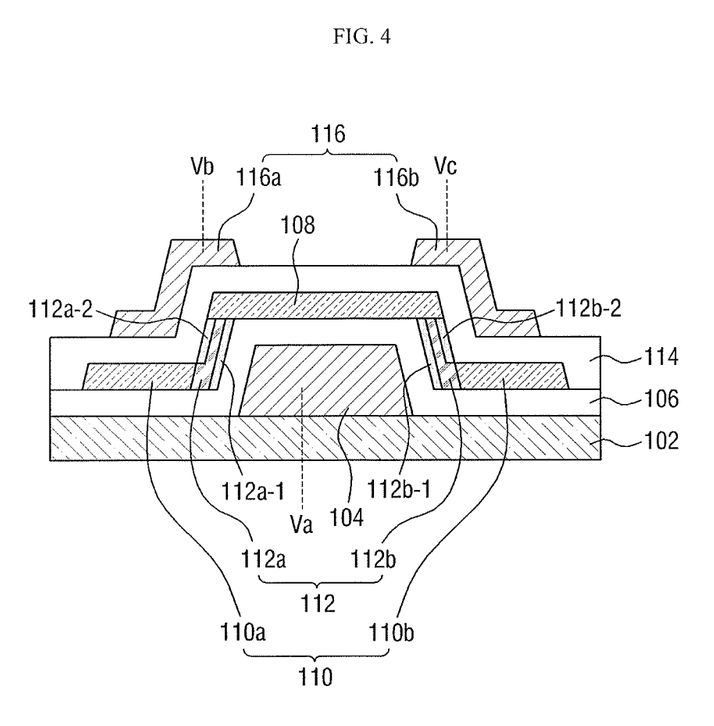
FIG. 4 illustrates a schematic cross-sectional view of voltage application to a bottom gate and a top gate of a thin film transistor substrate according to an embodiment of the present disclosure.

Further, the operation characteristic of a thin film transistor substrate 100 may be different according to the voltage which is applied to the bottom gate 104, the first top gate 116a, and the second top gate 116b. FIG. 4 illustrates a schematic cross-sectional view of voltage application to a bottom gate and a top gate of a thin film transistor substrate according to an embodiment of the present disclosure.

Referring to FIG. 4, the thin film transistor substrate 100 according to an embodiment of the present disclosure may be configured so that the same voltage may be applied to the bottom gate 104, the first top gate 116a, and the second top gate 116b, i.e., Va=Vb=Vc. Through such a configuration, four channels may be simultaneously formed at the inner channel areas 112a-1 and 112b-1 and the external channel areas 112a-2 and 112b-2, respectively. Thus, the carrier mobility may be improved. As such, the switching characteristics of the thin film transistor may be improved.

Figure 5:
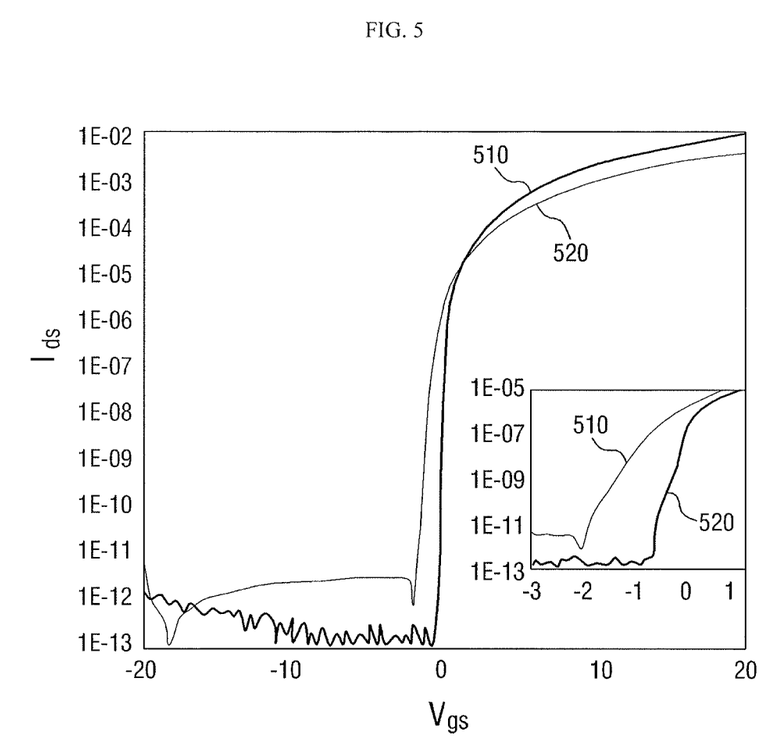
FIGS. 5 and 6 are graphs of a channel current as a function of Vgs voltage of a thin film transistor substrate according to an embodiment of the present disclosure.

FIG. 5 illustrates graphs of a channel current Ids as a function of voltage Vgs of the thin film transistor substrate 100. The horizontal axis of FIG. 5 indicates the voltage Vgs which is applied between the gates and the source, and the vertical axis indicates the current Ids between the drain and the source, i.e., the channel current.

FIG. 5 illustrates a first graph 510 indicating the channel current Ids when the same voltage is applied to the bottom gate 104, the first top gate 116a, and the second top gate 116b of the thin film transistor substrate 100, and a second graph 520 indicating the channel current Ids of a thin film transistor where voltage is applied only to a bottom gate. When comparing the first graph 510 with the second graph 520, if the channel is activated by the application of a threshold or higher Vgs voltage, it is shown that the channel current Ids of the first graph 510 has a higher value than the channel current Ids of the second graph 520.

That is, in the thin film transistor substrate 100 according to an embodiment of the present disclosure, four channels may be formed in the active layer 112. Thus, the carrier mobility may be improved, e.g., as compared to a conventional thin film transistor, thereby improving the switching operation characteristic of the thin film transistor substrate.

In another embodiments, referring to FIG. 4 again, the thin film transistor substrate 100 may have different voltages applied to the bottom gate 104, the first top gate 116a, and the second top gate 116b. For example, the bottom gate 104, the first top gate 116a, and the second top gate 116b may be configured so that a same voltage is applied to the first top gate 116a and the second top gate 116b, i.e., Vb=Vc, while a different voltage is applied to the bottom gate 104, i.e., Va≠Vb,Vc. Through such a configuration, the channel, which is formed on the inner channel areas 112a-1 and 112b-1 and the external channel areas 112a-2 and 112b-2, may be controlled, thereby improving the adjustability of the threshold voltage. As such, unnecessary power consumption may be reduced.

Figure 6:
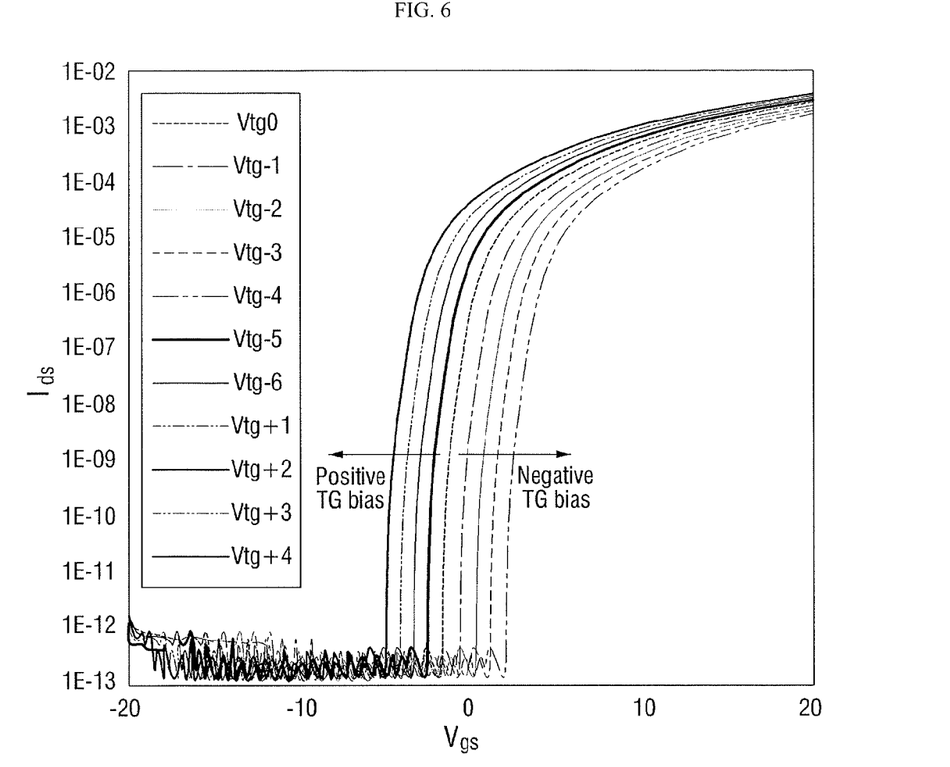

FIG. 6 illustrates a channel current Ids as a function of voltage Vgs of the thin film transistor substrate 100 according the other embodiment. The horizontal axis of FIG. 6 indicates the voltage Vgs which is applied between the top gate and the source, and the vertical axis indicates the current Ids between the drain and the source, i.e., the channel current.

Referring to FIG. 6, when the voltage is applied to the top gate 116 in a manner that the negative voltage gradually increases from 0V to (−6)V, i.e., from Vtg0 to Vtg−6, as the negative voltage increases, the threshold voltage gradually increases in a positive direction. In a reverse manner, when the voltage is applied to the top gate 116 in a manner that the positive voltage gradually increases from 0V to 4V, i.e., from Vtg0 to Vtg+4, as the positive voltage increases, the threshold voltage gradually increases in the negative direction.

That is, when it is configured that different voltages are applied to the bottom gate 104 and the top gate 116, the channel, which is formed at the inner channel areas 112a-1 and 112b-1 and external channel areas 112a-2 and 112b-2, may be controlled, and thus the adjustability of the threshold voltage may be improved. As such, unnecessary power consumption may be reduced. In other words, the threshold voltage may be more easily adjusted through channel control, and the adjustable range of the threshold voltage may be improved.

In yet another embodiment, referring to FIG. 4, the thin film transistor substrate 100 may be configured so that different voltages (Va≠Vb, Vb≠Vc, Va≠Vc) may be applied to each of the bottom gate 104, the first top gate 116a, and the second top gate 116b. Through such a configuration, the channel which is formed on the first external channel area 112a-2 and the channel which is formed on the second external channel area 112b-2 may be individually controlled, and thus the adjustability of the threshold voltage may be further improved. As such, unnecessary power consumption may be reduced.

In some embodiments, the drain 108 may be arranged so that at least part of the drain 108 may overlap with the bottom gate 104. However, such an overlapping structure is merely an example. The drain 108 may be arranged at various positions if the channel is formed at each of the first inner channel area 112a-1, the second inner channel area 112b-1, the first external channel area 112a-2, and the second external channel area 112b-2.

Hereinafter, a method of manufacturing the thin film transistor substrate 100 will be described.

Figure 7:
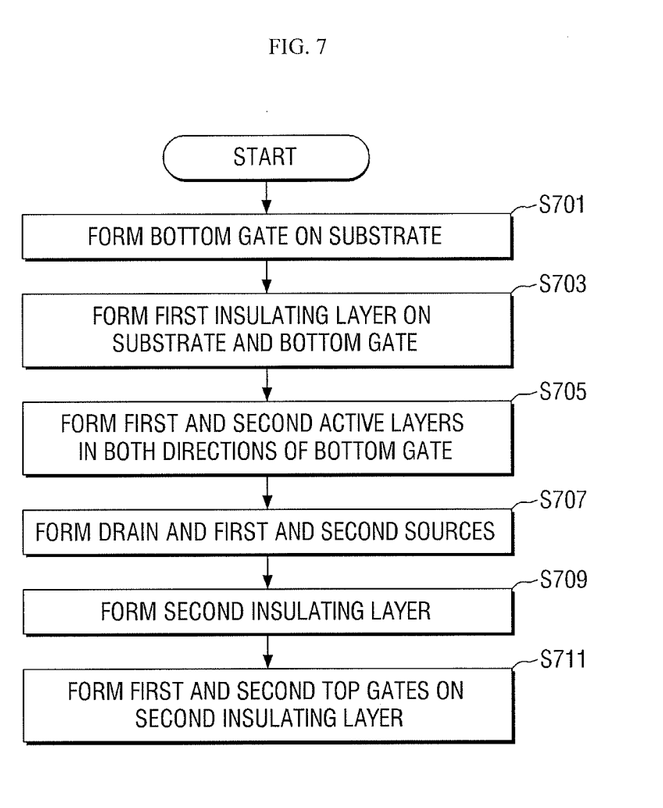
FIG. 7 illustrates a flowchart of a method of manufacturing a thin film transistor substrate according to an embodiment of the present disclosure.

FIG. 7 illustrates a flowchart of a method of manufacturing the thin film transistor substrate 100. FIGS. 8 to 13 are cross-sectional views of stages in a manufacturing process of the thin film transistor substrate 100.

Figure 8:
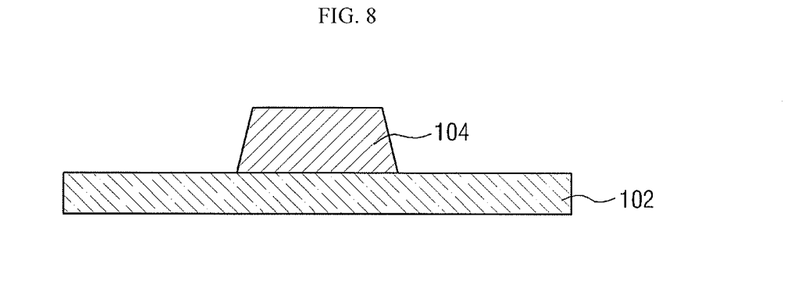
FIGS. 8 to 13 illustrate cross-sectional views of stages in a manufacturing process of a thin film transistor substrate according to an embodiment of the present disclosure.

Referring to FIGS. 7 and 8, first, the bottom gate 104 is formed on the substrate 102 (S701).

Figure 9:
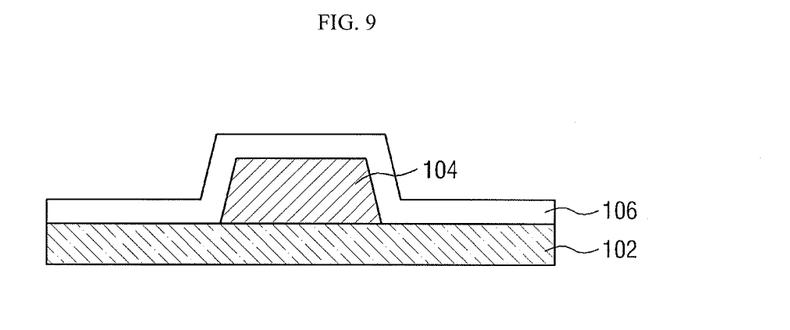

Thereafter, referring to FIGS. 7 and 9, the first insulating layer 106 is, e.g., conformally, formed on the substrate 102 and the bottom gate 104 (S703). The first insulating layer 106 may be formed as a layer of a certain thickness on the substrate 102 and the bottom gate 104.

Figure 10:
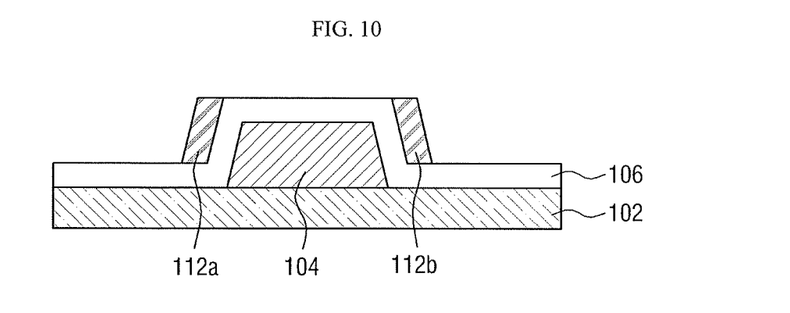

Thereafter, referring to FIGS. 7 and 10, the first active layer 112a and the second active layer 112b are formed near a bend or a step which is formed on the first insulating layer 106 due to the bottom gate 104 (S705). For example, as illustrated in FIG. 10, the first and second active layers 112a and 112b are formed along respective side surfaces of the bottom gate 104, so top surfaces of the first and second active layers 112a and 112b may be level with a top surface of the first insulating layer 106.

FIG. 10 illustrates the cross-section of the first active layer 112a and the second active layer 112b as having a parallelogram shape, but the shape of the cross-section is not limited to the parallelogram, e.g., may be formed in other various shapes such as a rectangular shape or a partly curved shape. For example, operation S705 may include the operation of forming an active layer on the entire first insulating layer 106, followed by the operation of forming the first active layer 112a and the second active layer 112b by partly etching the active layer to expose the top surface of the first insulating layer 106.

Figure 11:
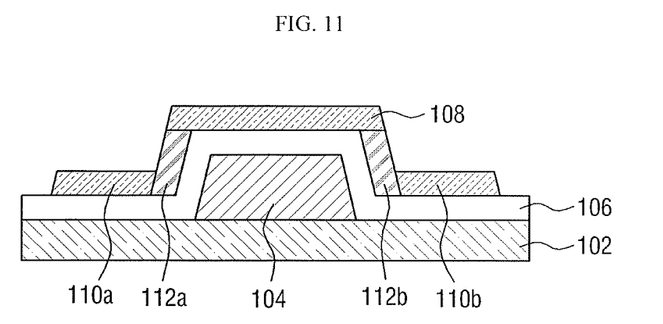

Thereafter, referring to FIGS. 7 and 11, the drain 108 is formed on the exposed top surface of the first insulating layer 106, so that the drain 108 may contact the first active layer 112a and the second active layer 112b. The first source 110a is formed on the first insulating layer 106, so that the first source 110a may contact the first active layer 112a at the first side of the drain 108. The second source 110b is formed on the first insulating layer 106, so that the second source 110b may contact the second active layer 112b at the second end of the drain 108 (S707). The drain 108 may be formed so that at least part of the drain 108 overlaps with the bottom gate 104 as shown in the attached drawings.

Operation S707 may include the operation of forming a conductive layer on the first insulating layer 106, the first active layer 112a, and the second active layer 112b, followed by the operation of forming the drain 108, the first source 110a, and the source 110b by partly etching the conductive layer, i.e., to remove the conductive layer from the active layer 112.

Figure 12:
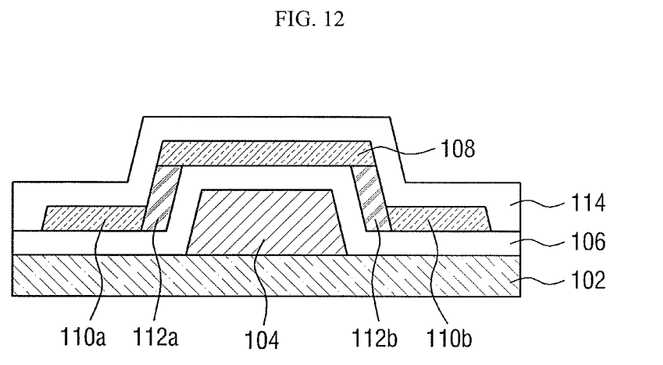

Thereafter, referring to FIGS. 7 and 12, the second insulating layer 114 is formed on the drain 108, the first source 110a, the second source 110b, the first active layer 112a, and the second active layer 112b (S709).

Figure 13:
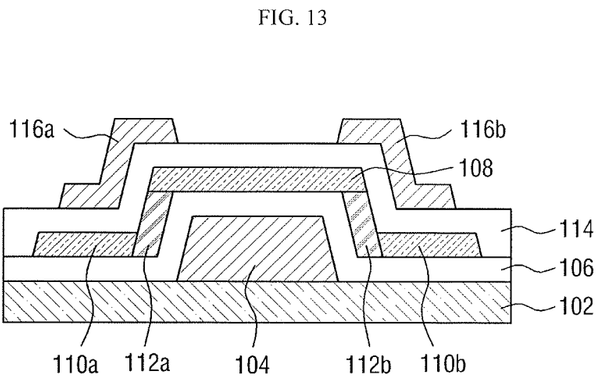

Thereafter, referring to FIGS. 7 and 13, the first top gate 116a is formed at one side of the bottom gate 104 on the second insulating layer 114, and the second top gate 116b is formed at the other side of the bottom gate 104 on the second insulating layer 114 (S711). Operation S711 may include the operation of forming a conductive layer on the second insulating layer 114, followed by the operation of forming the first top gate 116a and the second top gate 116b by partly etching the conductive layer.

The first active layer 112a and the second active layer 112b respectively include an inner channel area and an external channel area. The inner channel area may include an area where a channel is formed near the boundary with the first insulating layer 106 on the active layer 112. The inner channel area may include a first inner channel area which is an area where a channel is formed near the boundary with the first insulating layer 106 in the first active layer 112a, and a second inner channel area where a channel is formed near the boundary with the first insulating layer 106 in the second active layer 112b.

The external channel area may include an area where a channel is formed near the boundary with the second insulating layer 114 in the active layer 112. The external channel area may include a first external channel area which is an area where a channel is formed near the boundary with the second insulating layer 114, and a second inner channel area where a channel is formed near the boundary with the second insulating layer 114 on the second active layer 112b.

The method of manufacturing the thin film transistor substrate 100 according to an embodiment may further include an operation of applying the same voltage to the bottom gate 104, the first top gate 116a, and the second top gate 116b. Through such a configuration, four channels may be simultaneously formed in the inner channel area and the external channel area, and thus the carrier mobility may be improved and through which the switching characteristic of the thin film transistor substrate may be improved.

According to a method of manufacturing a thin film transistor substrate according to another embodiment, the bottom gate 104, the first top gate 116a, and the second top gate 116b may further include an operation of applying different voltages. That is, the same voltage may be applied to the first top gate 116a and the second top gate 116b, and another voltage may be applied to the bottom gate 104. Through such a configuration, the channels which are formed at the inner channel area and the external channel area may be respectively controlled, and thus the adjustability of the threshold voltage may be improved. As such, unnecessary power consumption may be reduced.

According to a method of manufacturing a thin film transistor substrate according to yet another embodiment, different voltages may be applied to the bottom gate 104, the first top gate 116a, and the second top gate 116b, respectively. Through such a configuration, the channel which is formed at the external channel area of the first active layer 112a and the channel which is formed at the external channel area of the second active layer 112b may be individually controlled, and thus the adjustability of the threshold voltage may be further improved. As such, unnecessary power consumption may be reduced.

Further, the thin film transistor substrate 100 according to an embodiment of the present disclosure may be applied to the liquid display panel at various modes, e.g., a plane to line switching mode (PLS), an in-plane switching (IPS) mode, a vertical alignment (VA) mode. Hereinafter, the case of application to a liquid crystal display panel by the PLS mode will be described.

Figure 14:
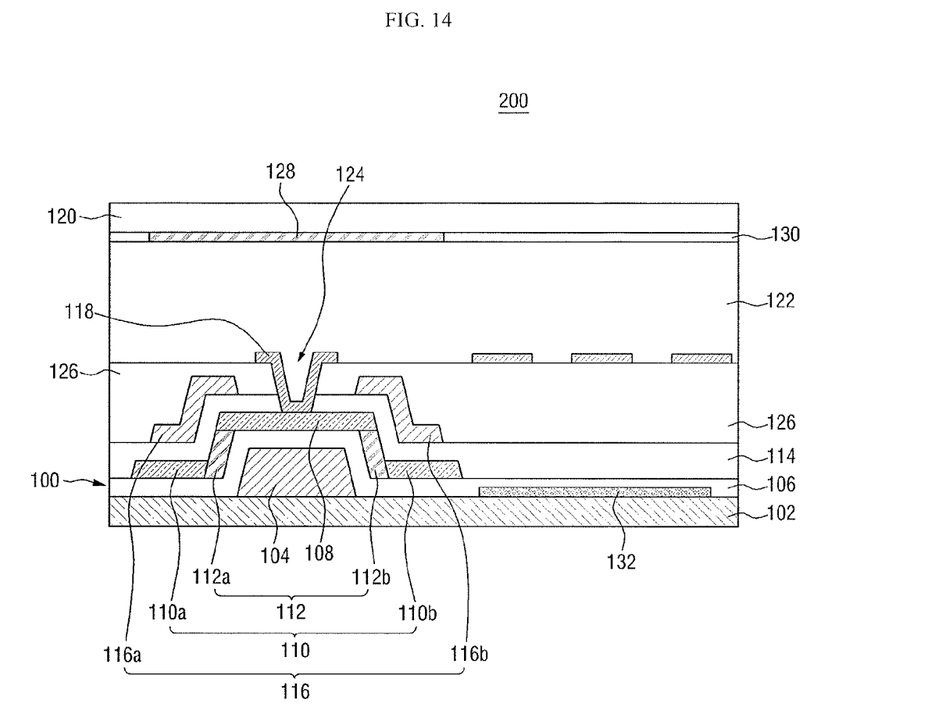
FIG. 14 illustrates a cross-sectional view of a liquid crystal display panel of a PLS mode including a thin film transistor substrate according to an embodiment of the present disclosure.

FIG. 14 illustrates a cross-sectional view of a liquid crystal display panel of a PLS mode including the thin film transistor substrate 100.

Referring to FIG. 14, a liquid crystal display panel 200 of PLS mode including the thin film transistor substrate 100 may include the substrate 102, the bottom gate 104 which is positioned on the substrate 102, the first insulating layer 106 which is positioned on the substrate 102 and the bottom gate 104, the drain 108 which is positioned on the first insulating layer 106, the source 110 including the first source 110a which is positioned on the first insulating layer 106 and is positioned at one side of the drain 108 and the second source 110b which is positioned on the first insulating layer 106 and is positioned at the other side of the drain 108, the active layer 112 including the first active layer 112a which is positioned on the first insulating layer 106 and contacts the drain 108 and the first source 110a and the second active layer 112b which is positioned on the first insulating layer 106 and contacts the drain 108 and the second source 110b, the second insulating layer 114 which is positioned on the drain 108, the source 110, and the active layer 112, the first top gate 116a and the second top gate 116b which are positioned on the second insulating layer 114, a pixel electrode 118 which is electrically connected to the drain 108, an opposed substrate 120 facing the thin film transistor substrate 100, and a liquid crystal layer 122 which is formed between the thin film transistor substrate 100 and the opposed substrate 120.

The liquid display panel 200 is arranged on the thin film transistor substrate 100, and may include a protective layer 126 where a contact hole 124 for exposing at least part of the drain 108 is formed. The contact hole 124 may be arranged between the first top gate 116a and the second top gate 116b, and the pixel electrode 118 may contact the drain 108 through the contact hole 124.

In some embodiments, as illustrated in FIG. 14, the pixel electrode 118 may be arranged on the protective layer 126, and a common electrode 132 for applying the driving voltage to the liquid crystal layer 122 may be arranged on the substrate 102. Liquid crystal molecules included in the liquid crystal layer 122 may be operated according to the fringe field which is formed by the pixel electrode 118 and the common electrode 132. However, the pixel electrode 118 and the common electrode 132 are not limited to the arrangement relationship shown in FIG. 14, and there may be various arrangement relations between predetermined insulating layers.

A black matrix 128 and a color filter 130 may be formed in the opposed substrate 120. The color filter 130 may include red, green, and blue color filters in order to implement images. The color filter 130 may be arranged in a stripe type which arranges the color file of the same color in pixel array units, a mosaic type which sequentially arranges the color filter of red, green, and blue in horizontal and vertical directions, and a delta type which arranges unit pixels in a vertical direction in a zigzag form and sequentially arranges color filters of red, green, and blue.

Each of the first active layer 112a and the second active layer 112b includes the inner channel area and the external channel area. The inner channel area may include an area where the channel is formed near the boundary with the first insulating layer 106. The external channel area may include an area where the channel is formed near the boundary with the second insulating layer 114 on the active layer 112.

By way of summation and review, according to embodiments, a thin film transistor substrate, a method of manufacturing the same, and a liquid crystal panel including the same may include switching characteristics of a thin film transistor substrate by improving the mobility of the carrier by forming four channels on the separated active layer. Further, the thin film transistor substrate, the method of manufacturing the same, and a liquid crystal panel including the same may reduce the power consumption by improving the adjustability of the threshold voltage. Further, the thin film transistor substrate, the method of manufacturing the same, and a liquid crystal panel including the same may improve negative bias temperature illumination stress (NB-TIS) and positive bias temperature illustration stress (PB-TIS) reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor substrate, comprising:
   a substrate;
   a bottom gate on the substrate;
   a first insulating layer on the substrate and on the bottom gate;
   a drain on the first insulating layer;
   a source on the first insulating layer, the source including a first source at a first side of the drain and a second source at a second side of the drain;
   an active layer on the first insulating layer, the active layer including a first active layer contacting the drain and the first source and a second active layer contacting the drain and the second source;
   a second insulating layer on the drain, the source, and the active layer; and
   a top gate on the second insulating layer.

2. The thin film transistor as claimed in claim 1, wherein each of the first active layer and the second active layer includes an inner channel area and an external channel area.

3. The thin film transistor as claimed in claim 2, wherein the inner channel area is adjacent to the first insulating layer.

4. The thin film transistor as claimed in claim 3, wherein the external channel area is adjacent to the second insulating layer.

5. The thin film transistor as claimed in claim 1, wherein the top gate includes:
   a first top gate on the second insulating layer at a first side of the bottom gate; and
   a second top gate on the second insulating layer at a second side of the bottom gate.

6. The thin film transistor substrate as claimed in claim 5, wherein a same voltage is set to be applied to the bottom gate, the first top gate, and the second top gate.

7. The thin film transistor substrate as claimed in claim 5, wherein a same voltage is set to be applied to the first top gate and the second top gate, and a different voltage is set to be applied to the bottom gate.

8. The thin film transistor substrate as claimed in claim 5, wherein different voltages are set to be applied to each of the bottom gate, the first top gate, and the second top gate.

9. The thin film transistor substrate as claimed in claim 5, wherein the first active layer and the second active layer extend along a bent surface of the bottom gate.

10. The thin film transistor substrate as claimed in claim 1, wherein at least a part of the drain overlaps with the bottom gate.

11. A method of manufacturing a thin film transistor, the method comprising:
    forming a bottom gate on a substrate;
    forming a first insulating layer on the substrate and the bottom gate;
    forming a first active layer and a second active layer on a bent portion of the first insulating layer;
    forming a drain on the first insulating layer to contact the first active layer and the second active layer;
    forming a first source on the first insulating layer to contact the first active layer at a first side of the drain, and forming a second source on the first insulating layer to contact the second active layer at the other side of the drain;
    forming a second insulating layer on the drain, the first source, the second source, the first active layer, and the second active layer; and
    forming a first top gate at one side of the bottom gate on the second insulating layer and forming a second top gate at the other side of the bottom gate on the second insulating layer.

12. The method as claimed in claim 11, wherein each of the first active layer and the second active layer includes an inner channel area and an external channel area.

13. The method as claimed in claim 12, wherein the inner channel area is adjacent to the first insulating layer.

14. The method as claimed in claim 13, wherein the external channel area is adjacent to the second insulating layer.

15. The method as claimed in claim 12, wherein a same voltage is set to be applied to the bottom gate, the first top gate, and the second top gate.

16. The method as claimed in claim 12, wherein a same voltage is set to be applied to the first top gate and the second top gate, and a different voltage is set to be applied to the bottom gate.

17. The method as claimed in claim 12, wherein different voltages are set to be applied to each of the bottom gate, the first top gate, and the second top gate.

18. The method as claimed in claim 11, wherein forming the drain includes forming the drain to at least partially overlap the bottom gate.

19. A liquid crystal display panel comprising:
    a thin film transistor substrate including:
       a bottom gate on a substrate,
       a first insulating layer on the substrate and on the bottom gate,
       a drain on the first insulating layer,
       a source on the first insulating layer, the source including a first source at a first side of the drain and a second source at a second side of the drain,
       an active layer on the first insulating layer, the active layer including a first active layer contacting the drain and the first source and a second active layer contacting the drain and the second source,
       a second insulating layer on the drain, the source, and the active layer, and
       a top gate on the second insulating layer;
    a pixel electrode electrically connected to the drain;
    an opposed substrate facing the thin film transistor substrate; and a liquid crystal layer between the thin film transistor substrate and the opposed substrate.

20. The liquid crystal display panel as claimed in claim 19, wherein each of the first active layer and the second active layer includes an inner channel area adjacent to the first insulating layer and an external channel area adjacent to the second insulating layer.

\* \* \* \* \*